(12) United States Patent
Lilak et al.

(10) Patent No.: US 11,664,373 B2
(45) Date of Patent: May 30, 2023

(54) ISOLATION WALLS FOR VERTICALLY STACKED TRANSISTOR STRUCTURES

(71) Applicant: Intel Corporation, Santa Clara, CA (US)

(72) Inventors: Aaron Lilak, Beaverton, OR (US); Patrick Morrow, Portland, OR (US); Gilbert Dewey, Beaverton, OR (US); Willy Rachmady, Beaverton, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/555,296

(22) Filed: Dec. 17, 2021

(65) Prior Publication Data
US 2022/0115372 A1    Apr. 14, 2022

Related U.S. Application Data

(63) Continuation of application No. 16/017,971, filed on Jun. 25, 2018, now Pat. No. 11,239,232.

(51) Int. Cl.
| | |
|---|---|
| *H01L 27/06* | (2006.01) |
| *H01L 21/82* | (2006.01) |
| *H01L 29/78* | (2006.01) |
| *H01L 29/06* | (2006.01) |
| *H01L 27/02* | (2006.01) |
| *H01L 23/522* | (2006.01) |
| *H01L 21/8234* | (2006.01) |
| *H01L 21/822* | (2006.01) |

(52) U.S. Cl.
CPC ...... *H01L 27/0688* (2013.01); *H01L 21/8221* (2013.01); *H01L 21/823431* (2013.01); *H01L 21/823481* (2013.01); *H01L 23/5226* (2013.01); *H01L 27/0207* (2013.01); *H01L 29/0649* (2013.01); *H01L 29/0673* (2013.01); *H01L 29/0684* (2013.01); *H01L 29/7851* (2013.01)

(58) Field of Classification Search
CPC ............ H01L 29/0649; H01L 29/0673; H01L 29/0684; H01L 29/7851; H01L 27/0207; H01L 27/0688; H01L 23/5226
USPC ...................................................... 257/401
See application file for complete search history.

(56) References Cited

U.S. PATENT DOCUMENTS

| | | | |
|---|---|---|---|
| 9,035,383 B2 * | 5/2015 | Bangsaruntip | ........ H01L 29/458 438/479 |
| 9,691,843 B2 | 6/2017 | Cappellani | |

* cited by examiner

*Primary Examiner* — Monica D Harrison
(74) *Attorney, Agent, or Firm* — Schwabe, Williamson & Wyatt P.C.

(57) ABSTRACT

Embodiments herein describe techniques for an integrated circuit (IC). The IC may include a lower device layer that includes a first transistor structure, an upper device layer above the lower device layer including a second transistor structure, and an isolation wall that extends between the upper device layer and the lower device layer. The isolation wall may be in contact with an edge of a first gate structure of the first transistor structure and an edge of a second gate structure of the second transistor structure, and may have a first width to the edge of the first gate structure at the lower device layer, and a second width to the edge of the second gate structure at the upper device layer. The first width may be different from the second width. Other embodiments may be described and/or claimed.

20 Claims, 9 Drawing Sheets

ISOLATION WALLS FOR VERTICALLY STACKED TRANSISTOR STRUCTURES

CROSS-REFERENCE TO RELATED APPLICATIONS

This application is a continuation of U.S. patent application Ser. No. 16/017,971, filed on Jun. 25, 2018, the entire contents of which is hereby incorporated by reference herein.

FIELD

Embodiments of the present disclosure generally relate to the field of integrated circuits, and more particularly, to vertically stacked transistor structures.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

With advancing technology, the scaling of features in integrated circuits (IC) has been a driving force behind an ever-growing semiconductor industry. Scaling to smaller and smaller features enables increased densities of functional units on semiconductor chips. As the lateral dimensions of a device structure shrink with each technology generation, it becomes increasingly difficult to reduce the sizes of the structures in lateral dimensions. Three-dimensional scaling is now of considerable interest as reductions in z-height (device thickness) offer another avenue of increasing overall device density and IC performance. Transistor structures may be vertically stacked to reduce the z-height of an IC while increasing the density. However, integration of vertically stacked transistor structures may still facing challenges in terms of power consumption and switching speed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
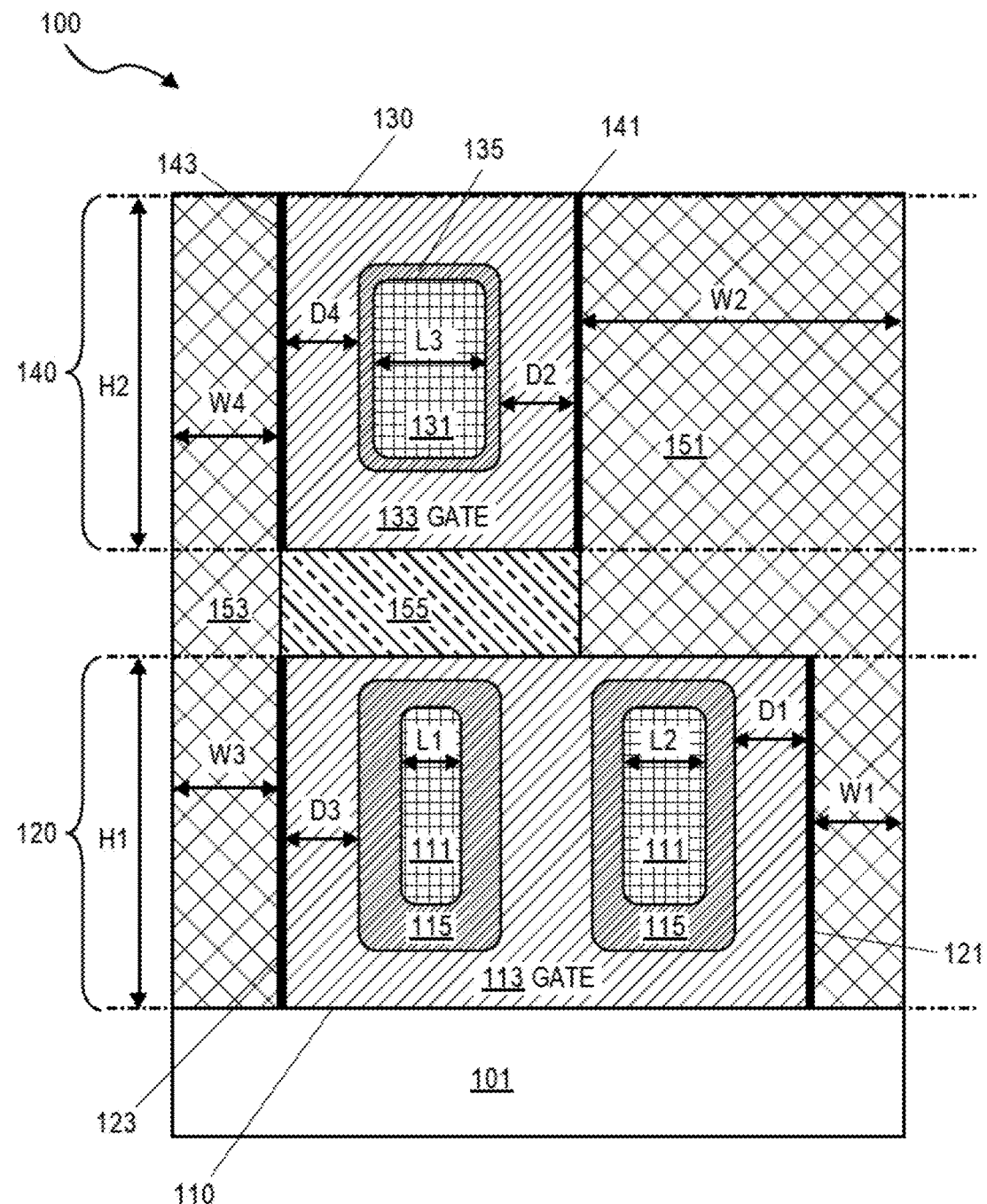
FIG. 1 schematically illustrates a diagram of an integrated circuit (IC) including vertically stacked transistor structures of different shapes, and an isolation wall having a first width at a lower device layer and a second width at an upper device layer, in accordance with some embodiments.

A transistor structure may include one or more transistors, a portion of a transistor, or other similar integrated circuit (IC) devices. For example, a transistor structure may include a channel, which may be a channel for a FinFET transistor, a nanowire transistor, a nanotube transistor, or other kinds of planar or non-planar 3 dimensional transistors. Additionally and alternatively, a transistor structure may include a set of transistor body structure, a gate structure separated from the set of transistor body structure by a gate dielectric layer. Even though the descriptions in the current disclosure may be presented often in terms of non-planar transistor structures, the descriptions can be equally applicable to planar transistor structures. Embodiments herein may include both planar and non-planar transistor structures.

Transistor structures may be vertically stacked to reduce the z-height of an IC while increasing the device density. However, integration of vertically stacked transistors may still facing challenges in terms of power consumption and switching speed. Currently, vertically stacked transistor structures may be separated by isolation walls of uniform sizes extending from an upper device layer to a lower device layer. However, when transistor structures at the upper device layer and the lower device layer may be of different sizes or shapes, such uniform sized isolation walls may induce significantly high gate capacitance. As a result of the high gate capacitance, the IC including the vertically stacked transistor structures may suffer in terms of power consumption and switching speed.

Embodiments herein may present techniques to reduce the gate capacitances while improving the power consumption and switching speed for an IC including vertically stacked transistor structures. Instead of uniform sized isolation walls, ICs may include isolation walls with different sizes and shapes to match the contour of the transistor structures at the upper device layer and the lower device layer. The shape and the structure of an isolation wall may be defined by the shapes and sizes of the transistor structures at the upper device layer and the lower device layer of the IC. An isolation wall may have different widths at different points at the upper device layer and the lower device layer. On the other hand, gate structures at the upper device layer and the lower device layer may have substantially equal gate width so that they may have substantially equal capacitance. Embodiments with substantially equal gate width for transistor structures at the upper device layer and the lower device layer may result in considerably lower gate capacitance, which may lead to lower power consumption and higher switching speed. In addition, the isolation wall may be wider and easier to register lithographically for purposes of forming electrical contact during the fabrication process.

Embodiments herein may present an IC including a lower device layer that includes a first transistor structure, an upper device layer above the lower device layer where the upper device layer may include a second transistor structure, and an isolation wall that extends between the upper device layer and the lower device layer. The first transistor structure may include a first set of non-planar transistor body structure, a first gate structure, and a first gate dielectric layer to separate the first set of non-planar transistor body structure from the first gate structure. The second transistor structure may include a second set of non-planar transistor body structure, a second gate structure, and a second gate dielectric layer to separate the second set of non-planar transistor body structure from the second gate structure. The isolation wall may be in contact with an edge of the first gate structure and an edge of the second gate structure, and may have a first width to the edge of the first gate structure at the lower device layer, and a second width to the edge of the second gate structure at the upper device layer. The first width may be different from the second width. In addition, the first gate structure may have a first gate width between the edge of the first gate structure and an edge of the first gate dielectric layer, the second gate structure may have a second gate width between the edge of the second gate structure and an edge of the second gate dielectric layer, and the first gate width and the second gate width may be substantially equal.

Embodiments herein may present a method for forming an IC. The method may include forming a lower device layer including a first transistor structure, where the first transistor structure may include a first set of non-planar transistor body structure, and a first set of gaps between components of the first set of non-planar transistor body structure. A gap of the first set of gaps has a first gap width. The method may also include forming an upper device layer above the lower device layer, the upper device layer including a second transistor structure, where the second transistor structure includes a second set of non-planar transistor body structure, and a second set of gaps between components of the second set of non-planar transistor body structure. A gap of the second set of gaps may have a second gap width different from the first gap width. The method may further include forming an insulating liner extending between the upper device layer and the lower device layer and conformally covering sidewalls of the first set of non-planar transistor body structure and sidewalls of the second set of non-planar transistor body structure. In addition, the method may include forming an isolation wall extending between the upper device layer and the lower device layer and filling the first set of gaps and the second set of gaps.

In embodiments, a computing device may include a circuit board and an IC coupled to the circuit board. The IC may include a lower device layer that includes a first transistor structure, an upper device layer above the lower device layer where the upper device layer may include a second transistor structure, and an isolation wall that extends between the upper device layer and the lower device layer. The first transistor structure may include a first set of non-planar transistor body structure, a first gate structure, and a first gate dielectric layer to separate the first set of non-planar transistor body structure from the first gate structure. The second transistor structure may include a second set of non-planar transistor body structure, a second gate structure, and a second gate dielectric layer to separate the second set of non-planar transistor body structure from the second gate structure. The isolation wall may be in contact with an edge of the first gate structure and an edge of the second gate structure, and may have a first width to the edge of the first gate structure at the lower device layer, and a second width to the edge of the second gate structure at the upper device layer. The first width may be different from the second width. In addition, the first gate structure may have a first gate width between the edge of the first gate structure and an edge of the first gate dielectric layer, the second gate structure may have a second gate width between the edge of the second gate structure and an edge of the second gate dielectric layer, and the first gate width and the second gate width may be substantially equal.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator or a semiconductor on insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of an IC 100 including vertically stacked transistor structures, e.g., a transistor structure 130 stacked over a transistor structure 110, and an isolation wall 151 having a first width W1 at a lower device layer 120 and a second width W2 at an upper device layer 140, in accordance with some embodiments. For clarity, features of the IC 100, the transistor structure 130, the transistor structure 110, the isolation wall 151, the lower device layer 120, and the upper device layer 140 may be described below as examples for understanding an example IC, a transistor structure, an isolation wall, a lower device layer, and an upper device layer. It is to be understood that there may be more or fewer components within IC, a transistor structure, an isolation wall, a lower device layer, and an upper device layer. Further, it is to be understood that one or more of the components within an example IC, a transistor structure, an isolation wall, a lower device layer, and an upper device layer, may include additional and/or varying features from the description below, and may include any device that one having ordinary skill in the art would consider and/or refer to as an example IC, a transistor structure, an isolation wall, a lower device layer, and an upper device layer.

In embodiments, the IC 100 may include the lower device layer 120 above a substrate 101, the upper device layer 140 above the lower device layer 120, and an insulator layer 155 between the lower device layer 120 and the upper device layer 140. The lower device layer 120 may have a first height H1 with respect to the substrate 101, and the upper device layer 140 may have a second height H2 with respect to the substrate 101, where the first height H1 may be different from the second height H2. The lower device layer 120 may include the transistor structure 110, and the upper device layer 140 may include the transistor structure 130. The isolation wall 151 and an isolation wall 153 may extend between the upper device layer 140 and the lower device layer 120, along two sides of the transistor structure 110 and the transistor structure 130.

In embodiments, the transistor structure 110 may be a nanoribbon structure, a nanowire structure, a FinFET structure, or other non-planar or planar transistor structure, and may include a set of non-planar transistor body structure 111, a gate structure 113, and a gate dielectric layer 115 to separate the set of non-planar transistor body structure 111 from the gate structure 113. The set of non-planar transistor body structure 111 may include multiple components, e.g., multiple fins, multiple nanowires, or multiple nanotubes. The transistor structure 110 may be rectangular, rounded, trapezoidal, or hourglass shaped. The transistor structure 110 may be a p-type transistor structure or an n-type transistor structure.

In embodiments, the transistor structure 130 may be a nanoribbon structure, a nanowire structure, a FinFET structure, or other non-planar or planar transistor structure, and may include a set of non-planar transistor body structure 131, a gate structure 133, and a gate dielectric layer 135 to separate the set of non-planar transistor body structure 131 from the gate structure 133. The set of non-planar transistor body structure 131 may include multiple components, e.g., multiple fins, multiple nanowires, or multiple nanotubes. The transistor structure 130 may be rectangular, rounded, trapezoidal, or hourglass shaped. The transistor structure 130 may be a p-type transistor structure or an n-type transistor structure. In embodiments, the transistor structure 110 may be a nanoribbon structure, a nanowire structure, or a FinFET structure, and the transistor structure 130 may be different from the transistor structure 110. The components shown in FIG. 1, e.g., the gate dielectric layer 135, the gate structure 133, the set of non-planar transistor body structure 131, and other components, are shown for illustration purpose only, and not indicative of their relative sizes, shapes, and relative positions. The components shown in FIG. 1 may be of any sizes, shapes, positions that one having ordinary skill in the art would consider and/or refer to for the corresponding components.

In embodiments, the transistor structure 110 may be a FinFET structure with 2 fins, and the transistor structure 130 may be a FinFET structure with one fin. In general, the transistor structure 110 may be a FinFET structure with a first number of fins, and the transistor structure 130 may be a FinFET structure with a second number of fins, where the first number is different from the second number. In addition, a first fin 111 of the transistor structure 110 may have a body width L1, a second fin 111 of the transistor structure 110 may have a body width L2, and a fin 131 of the transistor structure 130 may have a body width L3, where the sizes of L1, L2, or L3 may be different.

In embodiments, the isolation wall 151 may be in contact with an edge 121 of the gate structure 113 and an edge 141 of the gate structure 133. The isolation wall 151 may have a first width W1 to the edge 121 of the gate structure 113 at the lower device layer 120, and a second width W2 to the edge 141 of the gate structure 133 at the upper device layer 140, and the first width W1 may be different from the second width W2. The gate structure 113 may have a first gate width D1 between an edge 121 of the gate structure 113 and an edge of the gate dielectric layer 115, while the gate structure 133 may have a second gate width D2 between the edge 141 of the gate structure 133 and an edge of the gate dielectric layer 135, where the first gate width D1 and the second gate width D2 may be substantially equal.

In embodiments, the isolation wall 153 may be in contact with an edge 123 of the gate structure 113 and an edge 143 of the gate structure 133. The isolation wall 153 may have a third width W3 to the edge 123 of the gate structure 113 at the lower device layer 120, and a fourth width W4 to the edge 143 of the gate structure 133 at the upper device layer 140, and the third width W3 may be a same or different from the fourth width W4. The gate structure 113 may have a third gate width D3 between an edge 123 of the gate structure 113 and an edge of the gate dielectric layer 115, while the gate structure 133 may have a fourth gate width D4 between the edge 143 of the gate structure 133 and an edge of the gate dielectric layer 135, where the third gate width D3 and the second gate width D4 may be substantially equal. In addition, the first gate width D1, the second gate width D2, the third gate width D3, and the second gate width D4 may all be substantially equal.

In embodiments, the insulator layer 155 may be of a planar shape, and includes an oxide material. The insulator layer 121 may have a thickness in a range of about 2 nm to about 100 nm. Insulator region 121 could be comprised of an insulating material such as silicon dioxide, silicon nitride, carbon-doped silicon nitride, a high-k material or other materials. In addition, the isolation wall 151 and the isolation wall 153 may include a material selected from silicon dioxide, silicon nitride, a high-k material or other insulating materials. In some embodiments, the isolation wall is comprised of two or more regions where the top-most portion may be a different material than the bottom material. [Note in our preferred embodiment, the top of the isolation wall may be high-k and bottom silicon nitride which is chosen for etch selectivity and mechanical stability.

In embodiments, the transistor structure 110 may include the set of non-planar transistor body structure 111, which may include one or more p-type transistors. The set of non-planar transistor body structure 111 may include a material selected from CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, or $VO_2$, or an oxide alloyed or doped with S, Se, Te, or an element to raise a valence-band of the oxide to be a doped p-type oxide. Additionally and alternatively, the transistor structure 110 may include the set of non-planar transistor body structure 111, which may include one or more n-type transistors. The set of non-planar transistor body structure 111 may include a material selected from ZnO, CdO, $In_2O_3$, $Ga_2O_3$, $SnO_2$, IGZO, IZO, ITO, GZO, $TiO_2$, SiC, SnO, $Cu_2O$, or $VO_2$, or an oxide alloyed or doped with In, Sn, Zn, Mo, Ti, Co, Cd, to lower a conduction band of the oxide to be a doped n-type oxide. Additionally and alternatively, in embodiments, the set of non-planar transistor body structure 111 may include a material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), AlZnO, HfInZnO (HIZO), AlSnZnInO, AlSnZnO (ATZO). In embodiments, the transistor structure 130 may include the set of non-planar transistor body structure 131, which may include similar materials included in the transistor structure 110 or the set of non-planar transistor body structure 111.

In embodiments, the substrate 101 may be a silicon substrate, a silicon-germanium alloy substrate, a germanium substrate, a glass substrate, such as soda lime glass or borosilicate glass, a metal substrate, a plastic substrate, or another suitable substrate. In addition, some dielectric layer or other devices may be formed on the substrate 101, not shown for clarity.

In embodiments, the gate dielectric layer 115 or the gate dielectric layer 135 may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials. For example, the gate dielectric layer 115 or the gate dielectric layer 135 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 115 or the gate dielectric layer 135 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium (IV) oxide ($HfO_2$), tantalum oxide ($Ta_2O_5$), titanium dioxide ($TiO_2$), or other materials.

In embodiments, the gate structure 113 or the gate structure 133 may be formed as a single layer or a stacked layer using one or more conductive films including a conductive material. For example, the gate structure 113 or the gate structure 133 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the gate structure 113 or the gate structure 133 may include tantalum nitride (TaN), titanium nitride (TiN), iridium-tantalum alloy (Ir—Ta), indium-tin oxide (ITO), the like, and/or a combination thereof.

There may be additional components, e.g., a spacer, a passivation layer, included in the transistor structure 110 or the transistor structure 130, which are not shown in FIG. 1. For example, the transistor structure 110 or the transistor structure 130 may include a spacer with a dielectric material, a passivation layer having one or more materials capable of providing passivation, such as physical, chemical and/or electrical insulation, isolation, stability and/or separation between two or more other layers.

Figure 2:
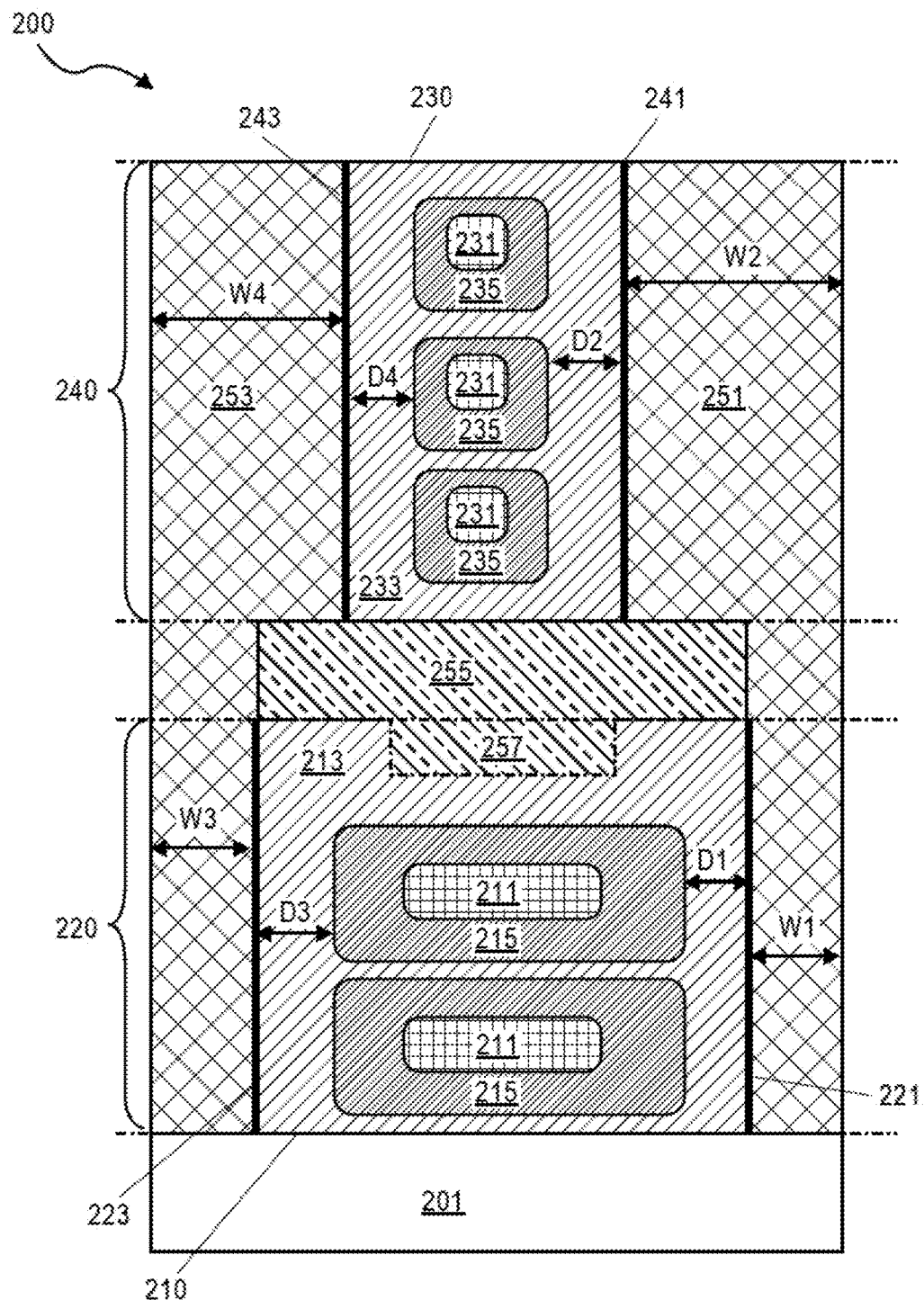
FIG. 2 schematically illustrates a diagram of an IC including vertically stacked transistor structures of different shapes, and an isolation wall having a first width at a lower device layer and a second width at an upper device layer, in accordance with some embodiments.

FIG. 2 schematically illustrates a diagram of an IC 200 including vertically stacked transistor structures, e.g., a transistor structure 230 stacked over a transistor structure 210, and an isolation wall 251 having a first width W1 at a lower device layer 220 and a second width W2 at an upper device layer 240, in accordance with some embodiments. In embodiments, the IC 200, the transistor structure 230, the transistor structure 210, the isolation wall 251, the lower device layer 220, and the upper device layer 240 may be similar to the IC 100, the transistor structure 130, the transistor structure 110, the isolation wall 151, the lower device layer 120, and the upper device layer 140 shown in FIG. 1. Various other layers of the IC 200, the transistor structure 230, the transistor structure 210, the isolation wall 251, the lower device layer 220, or the upper device layer 240, may be similar to corresponding layers in the IC 100, the transistor structure 130, the transistor structure 110, the isolation wall 151, the lower device layer 120, or the upper device layer 140.

In embodiments, the IC 200 may include the lower device layer 220 above a substrate 201, the upper device layer 240 above the lower device layer 220, and an insulator layer 255 between the lower device layer 220 and the upper device layer 240. The lower device layer 220 may include the transistor structure 210, and the upper device layer 240 may include the transistor structure 230. The isolation wall 251 and an isolation wall 253 may extend between the upper device layer 240 and the lower device layer 220, along two sides of the transistor structure 210 and the transistor structure 230. The lower device layer 220 may further include an insulator area 257 next to the transistor structure 210. Additionally and alternatively, the upper device layer 240 may further include an insulator area next to the transistor structure 230, not shown. The insulator area 257 next to the transistor structure 210 may adjust an area the transistor structure 210 may occupy.

In embodiments, the transistor structure 210 may be a nanoribbon structure, and may include a set of non-planar transistor body structure 211, a gate structure 213, and a gate dielectric layer 215 to separate the set of non-planar transistor body structure 211 from the gate structure 213. The set of non-planar transistor body structure 211 may include multiple components, e.g., multiple nanoribbons. The transistor structure 230 may be a nanowire structure, and may include a set of non-planar transistor body structure 231, a gate structure 233, and a gate dielectric layer 235 to separate the set of non-planar transistor body structure 231 from the gate structure 233. The set of non-planar transistor body structure 231 may include multiple nanowires. In embodiments, the transistor structure 210 may be a nanoribbon structure with 2 nanoribbons, and the transistor structure 230 may be a nanowire structure with 3 nanowires.

In embodiments, the isolation wall 251 may be in contact with an edge 221 of the gate structure 213 and an edge 241 of the gate structure 233. The isolation wall 251 may have a first width W1 to the edge 221 of the gate structure 213 at the lower device layer 220, and a second width W2 to the edge 241 of the gate structure 233 at the upper device layer 240, and the first width W1 may be different from the second width W2. The gate structure 213 may have a first gate width D1 between an edge 221 of the gate structure 213 and an edge of the gate dielectric layer 215, while the gate structure 233 may have a second gate width D2 between the edge 241 of the gate structure 233 and an edge of the gate dielectric layer 235, where the first gate width D1 and the second gate width D2 may be substantially equal.

In embodiments, the isolation wall 253 may be in contact with an edge 223 of the gate structure 213 and an edge 243 of the gate structure 233. The isolation wall 253 may have a third width W3 to the edge 223 of the gate structure 213 at the lower device layer 220, and a fourth width W4 to the edge 243 of the gate structure 233 at the upper device layer 240, and the third width W3 may be different from the fourth width W4. The gate structure 213 may have a third gate width D3 between the edge 223 of the gate structure 213 and an edge of the gate dielectric layer 215, while the gate structure 233 may have a fourth gate width D4 between the edge 243 of the gate structure 233 and an edge of the gate dielectric layer 235, where the third gate width D3 and the second gate width D4 may be substantially equal. In addition, the first gate width D1, the second gate width D2, the third gate width D3, and the second gate width D4 may all be substantially equal. The insulator area 257 next to the transistor structure 210 may reduce the size of the gate structure 213 and hence its capacitance as well.

Figure 3:
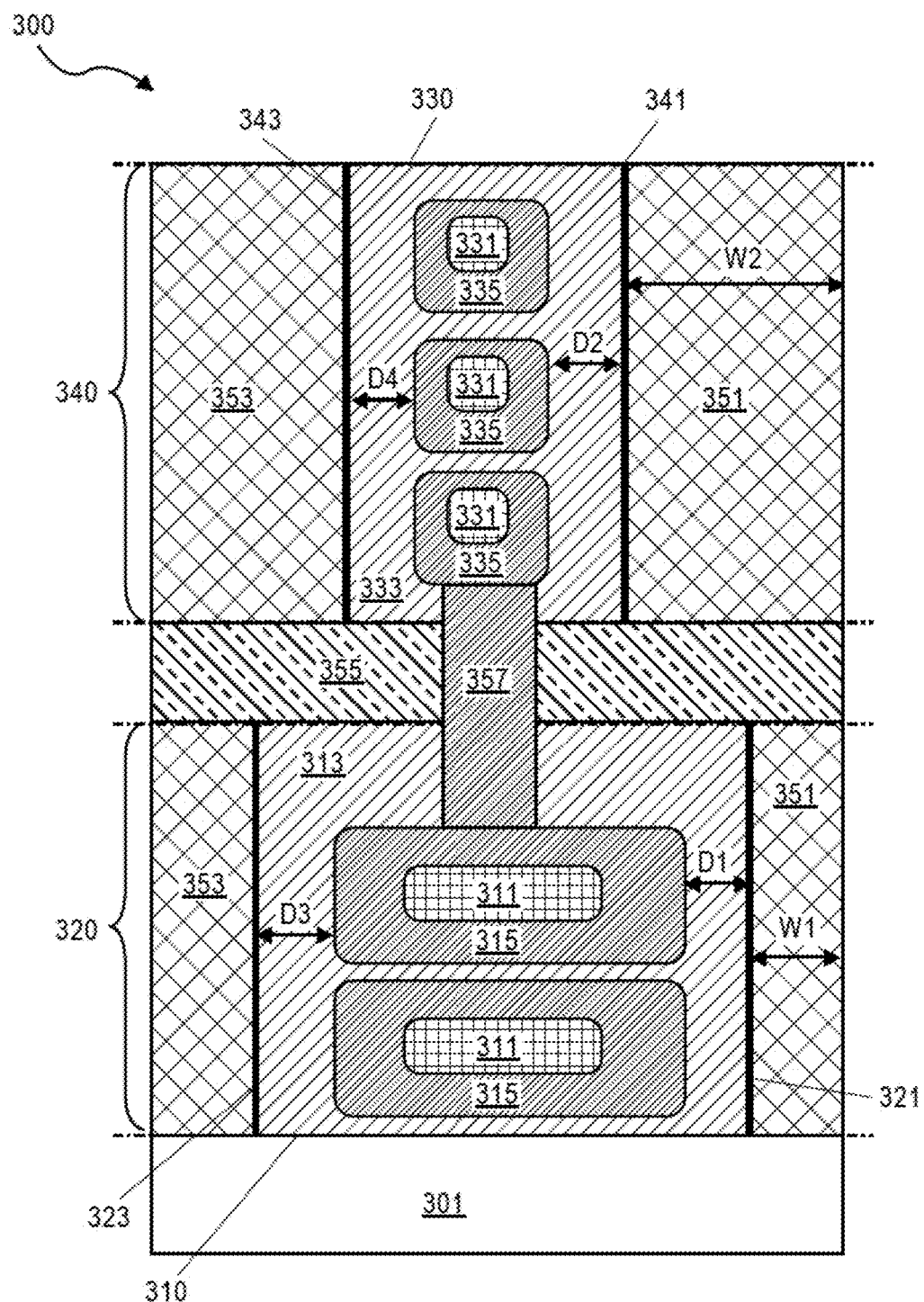
FIG. 3 schematically illustrates a diagram of an IC including vertically stacked transistor structures of different shapes, and an isolation wall having a first width at a lower device layer and a second width at an upper device layer, in accordance with some embodiments.

FIG. 3 schematically illustrates a diagram of an IC 300 including vertically stacked transistor structures, e.g., a transistor structure 330 stacked over a transistor structure 310, and an isolation wall 351 having a first width W1 at a lower device layer 320 and a second width W2 at an upper device layer 340, in accordance with some embodiments. In embodiments, the IC 300, the transistor structure 330, the transistor structure 310, the isolation wall 351, the lower device layer 320, and the upper device layer 340 may be similar to the IC 100, the transistor structure 130, the transistor structure 110, the isolation wall 151, the lower device layer 120, and the upper device layer 140 shown in FIG. 1. Various other layers of the IC 300, the transistor structure 330, the transistor structure 310, the isolation wall 351, the lower device layer 320, and the upper device layer 340, may be similar to corresponding layers in the IC 100, the transistor structure 130, the transistor structure 110, the isolation wall 151, the lower device layer 120, and the upper device layer 140.

In embodiments, the IC 300 may include the lower device layer 320 above a substrate 301, the upper device layer 340 above the lower device layer 320, and an insulator layer 355 between the lower device layer 320 and the upper device layer 340. The lower device layer 320 may include the transistor structure 310, and the upper device layer 340 may include the transistor structure 330. The isolation wall 351 and an isolation wall 353 may extend between the upper device layer 340 and the lower device layer 320, along two sides of the transistor structure 310 and the transistor structure 330. In embodiments, the IC 300 may include a via 357 through the insulator layer 355 to couple a portion of the transistor structure 310 to a portion of the transistor structure 330. In addition, the insulator layer 355 may break the isolation wall 351 into a first portion at the lower device layer 320 and a second portion at the upper device layer 340, and the first portion is disjoint from the second portion.

In embodiments, the transistor structure 310 may be a nanoribbon structure, and may include multiple nanoribbons 311, a gate structure 313, and a gate dielectric layer 315 to separate the multiple nanoribbons 311 from the gate structure 313. The transistor structure 330 may be a nanowire structure, and may include multiple nanowires 331, a gate structure 333, and a gate dielectric layer 335 to separate the set of multiple nanowires 331 from the gate structure 333. In embodiments, the transistor structure 310 may be a nanoribbon structure with 2 nanoribbons, and the transistor structure 330 may be a nanowire structure with 3 nanowires.

In embodiments, the isolation wall 351 may be in contact with an edge 321 of the gate structure 313 and an edge 341 of the gate structure 333, the isolation wall 351 may have a first width W1 to the edge 321 of the gate structure 313 at the lower device layer 320, and a second width W2 to the edge 341 of the gate structure 333 at the upper device layer 340, and the first width W1 may be different from the second width W2. The gate structure 313 may have a first gate width D1 between an edge 321 of the gate structure 313 and an edge of the gate dielectric layer 315, while the gate structure 333 may have a second gate width D2 between the edge 341 of the gate structure 333 and an edge of the gate dielectric layer 335, where the first gate width D1 and the second gate width D2 may be substantially equal.

In embodiments, the isolation wall 353 may be in contact with an edge 323 of the gate structure 313 and an edge 343 of the gate structure 333, the isolation wall 353 may have a third width W3 to the edge 323 of the gate structure 313 at the lower device layer 320, and a fourth width W4 to the edge 343 of the gate structure 333 at the upper device layer 340, and the third width W3 may be different from the fourth width W4. The gate structure 313 may have a third gate width D3 between an edge 323 of the gate structure 313 and an edge of the gate dielectric layer 315, while the gate structure 333 may have a fourth gate width D4 between the edge 343 of the gate structure 333 and an edge of the gate dielectric layer 335, where the third gate width D3 and the second gate width D4 may be substantially equal. In addition, the first gate width D1, the second gate width D2, the third gate width D3, and the second gate width D4 may all be substantially equal.

Figure 4:
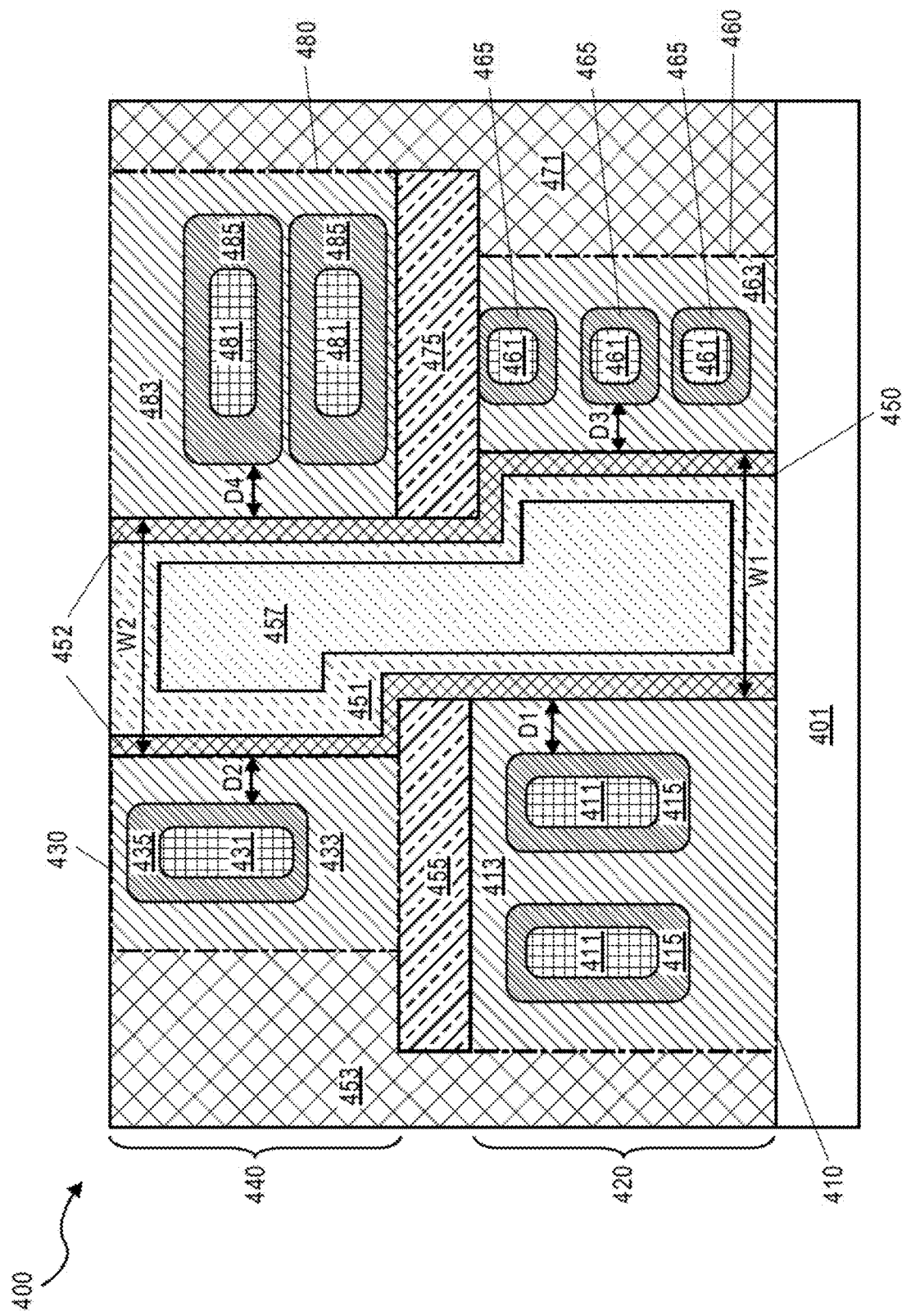
FIG. 4 schematically illustrates a diagram of an IC including vertically stacked transistor structures of different shapes, and an isolation wall filling a gap between two vertically stacked transistor structures, the isolation wall having a first width at a lower device layer and a second width at an upper device layer, in accordance with some embodiments.

FIG. 4 schematically illustrates a diagram of an IC 400 including vertically stacked transistor structures, e.g., a transistor structure 430 stacked over a transistor structure 410, or a transistor structure 480 stacked over a transistor structure 460, and an isolation wall 451 filling a gap 450 between two vertically stacked transistor structures, the isolation wall having a first width at a lower device layer 420 and a second width at an upper device layer 440, in accordance with some embodiments. In embodiments, the IC 400, the transistor structure 430, the transistor structure 410, the transistor structure 480, the transistor structure 460, the isolation wall 451, the lower device layer 420, and the upper device layer 440 may be similar to the IC 100, the transistor structure 130, the transistor structure 110, the isolation wall 151, the lower device layer 120, and the upper device layer 140 shown in FIG. 1. Various other layers of the IC 400, the transistor structure 430, the transistor structure 410, the transistor structure 480, the transistor structure 460, the isolation wall 451, the lower device layer 420, and the upper device layer 440, may be similar to corresponding layers in the IC 100, the transistor structure 130, the transistor structure 110, the isolation wall 151, the lower device layer 120, and the upper device layer 140.

In embodiments, the IC 400 may include the lower device layer 420 above a substrate 401, the upper device layer 440 above the lower device layer 420. The transistor structure 430 may be vertically stacked over the transistor structure 410 and separated by an insulator layer 455, while and the transistor structure 480 may be vertically stacked over a transistor structure 460 and separated by an insulator layer 475. The transistor structure 430 and the transistor structure 480 may be at the upper device layer 440, while the transistor structure 410 and the transistor structure 460 may be at the lower device layer 420. The gap 450 may exist between the transistor structure 430 vertically stacked over the transistor structure 410, and the transistor structure 480 vertically stacked over the transistor structure 460. The isolation wall 451 may fill the gap 450. The isolation wall 451 may include a conductor 457. The isolation wall 451 may also include an insulating liner 452 conformal to sidewalls of the isolation wall 451. The conductor 457 may be used to route signals between the lower device layer 420 and the upper device layer 440. The isolation wall 451 may have a first width W1 at a lower device layer 420 and a second width W2 at an upper device layer 440, as shown in FIG. 4.

In embodiments, the transistor structure 410 may be a FinFET structure, and may include multiple fins 411, a gate structure 413, and a gate dielectric layer 415 to separate the multiple nanoribbons 411 from the gate structure 413. The transistor structure 430 may be a FinFET structure, and may include one or more fins 431, a gate structure 433, and a gate dielectric layer 435 to separate the fins 431 from the gate structure 433. In embodiments, the transistor structure 410 may be a FinFET structure with 2 fins, and the transistor structure 430 may be a FinFET structure with 1 fin. The gate structure 413 may have a first gate width D1 between an edge of the gate structure 413 and an edge of the gate dielectric layer 415, while the gate structure 433 may have a second gate width D2 between an edge of the gate structure 433 and an edge of the gate dielectric layer 435, where the first gate width D1 and the second gate width D2 may be substantially equal.

In embodiments, the transistor structure 460 may be a nanowire structure, and may include multiple nanowires 461, a gate structure 463, and a gate dielectric layer 465 to separate the multiple nanoribbons 461 from the gate structure 463. The transistor structure 480 may be a nanoribbon structure, and may include multiple nanoribbons 481, a gate structure 483, and a gate dielectric layer 485 to separate the set of multiple nanoribbons 481 from the gate structure 483. In embodiments, the transistor structure 460 may be a nanowire structure with 3 nanowires, and the transistor structure 480 may be a nanoribbon structure with 2 nanoribbons. The gate structure 463 may have a third gate width D3 between an edge of the gate structure 463 and an edge of the gate dielectric layer 465, while the gate structure 483 may have a fourth gate width D4 between the edge of the gate structure 483 and an edge of the gate dielectric layer 485, where the third gate width D3 and the fourth gate width D4 may be substantially equal. In addition, the first gate width D1, the second gate width D2, the third gate width D3, and the fourth gate width D4 may be substantially equal.

Figure 5:
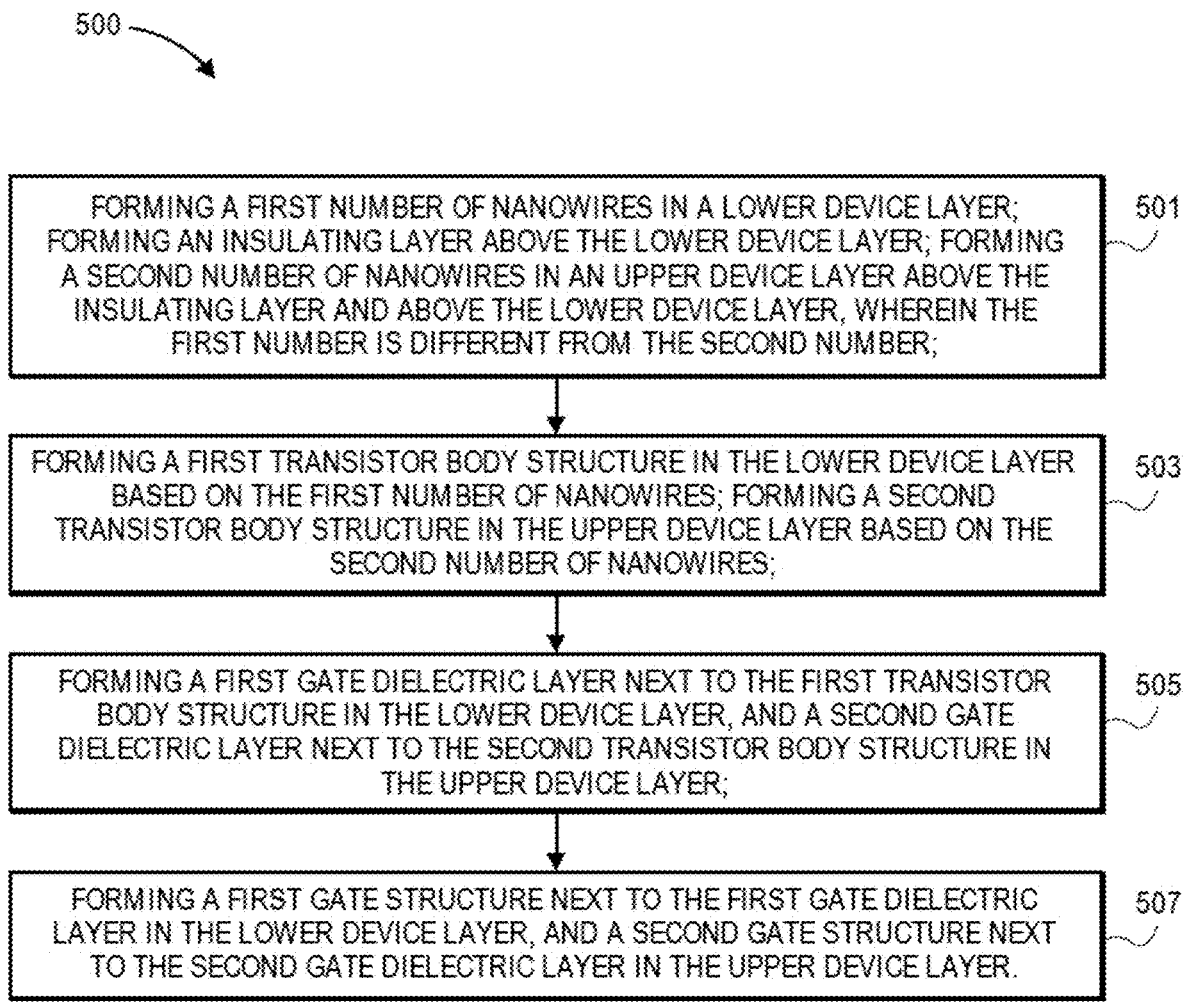
FIG. 5 illustrates a process for forming an IC including a transistor structures vertically stacked over another transistor structure of different shapes, in accordance with some embodiments.

FIG. 5 illustrates a process 500 for forming an IC including a transistor structures vertically stacked over another transistor structure of different shapes, in accordance with some embodiments. In embodiments, the process 500 may be applied to form the IC 100 including the transistor structure 130 stacked over the transistor structure 110 in FIG. 1, the IC 200 including the transistor structure 230 stacked over the transistor structure 210 in FIG. 2, the IC 300 including the transistor structure 330 stacked over the transistor structure 310 in FIG. 3, the transistor structure 430 stacked over the transistor structure 410, or the transistor structure 480 stacked over the transistor structure 460 in FIG. 4. The process 500 may include descriptions for nanowire transistor structures including nanowire. In addition, the process 500 may be equally applicable to other transistor structures such as FinFET or nanoribbons.

At block 501, the process 500 may include forming a first number of nanowires in a lower device layer, forming an insulating layer above the lower device layer, and forming a second number of nanowires in an upper device layer above the insulating layer and above the lower device layer, where the first number is different from the second number. For example, the process 500 may be applied to form the IC 200 where the transistor structure 210 may be replaced by a nanowire structure. The process 500 may include forming 2 nanowires in a lower device layer 220, forming an insulating layer 255 above the lower device layer 220, and forming 3 nanowires in an upper device layer 240 above the insulating layer 255 and above the lower device layer 220.

At block 503, the process 500 may include forming a first transistor body structure in the lower device layer based on the first number of nanowires, and forming a second transistor body structure in the upper device layer based on the second number of nanowires. For example, the process 500 may be applied to form the transistor body structure 211 at the lower device layer 220 by removing portions of the nanowires, and form the transistor body structure 231 at the lower device layer 240 by removing portions of the nanowires.

At block 505, the process 500 may include forming a first gate dielectric layer next to the first transistor body structure in the lower device layer, and a second gate dielectric layer next to the second transistor body structure in the upper device layer. For example, the process 500 may be applied to form the gate dielectric layer 215 next to the transistor body structure 211 in the lower device layer 220, and the gate dielectric layer 235 next to the transistor body structure 231 in the upper device layer 240.

At block 507, the process 500 may include forming a first gate structure next to the first gate dielectric layer in the lower device layer, and a second gate structure next to the second gate dielectric layer in the upper device layer. For example, the process 500 may be applied to form the gate structure 215 next to the gate dielectric layer 215 in the lower device layer 220, and the gate structure 235 next to the gate dielectric layer 235 in the upper device layer 240. The gate structure 213 may have a first gate width D1 between an edge of the gate structure 213 and an edge of the gate dielectric layer 215, the gate structure 233 may have a second gate width D2 between an edge of the gate structure 213 and an edge of the gate dielectric layer 215, and the first gate width D1 and the second gate width D2 may be substantially equal.

Figure 6:
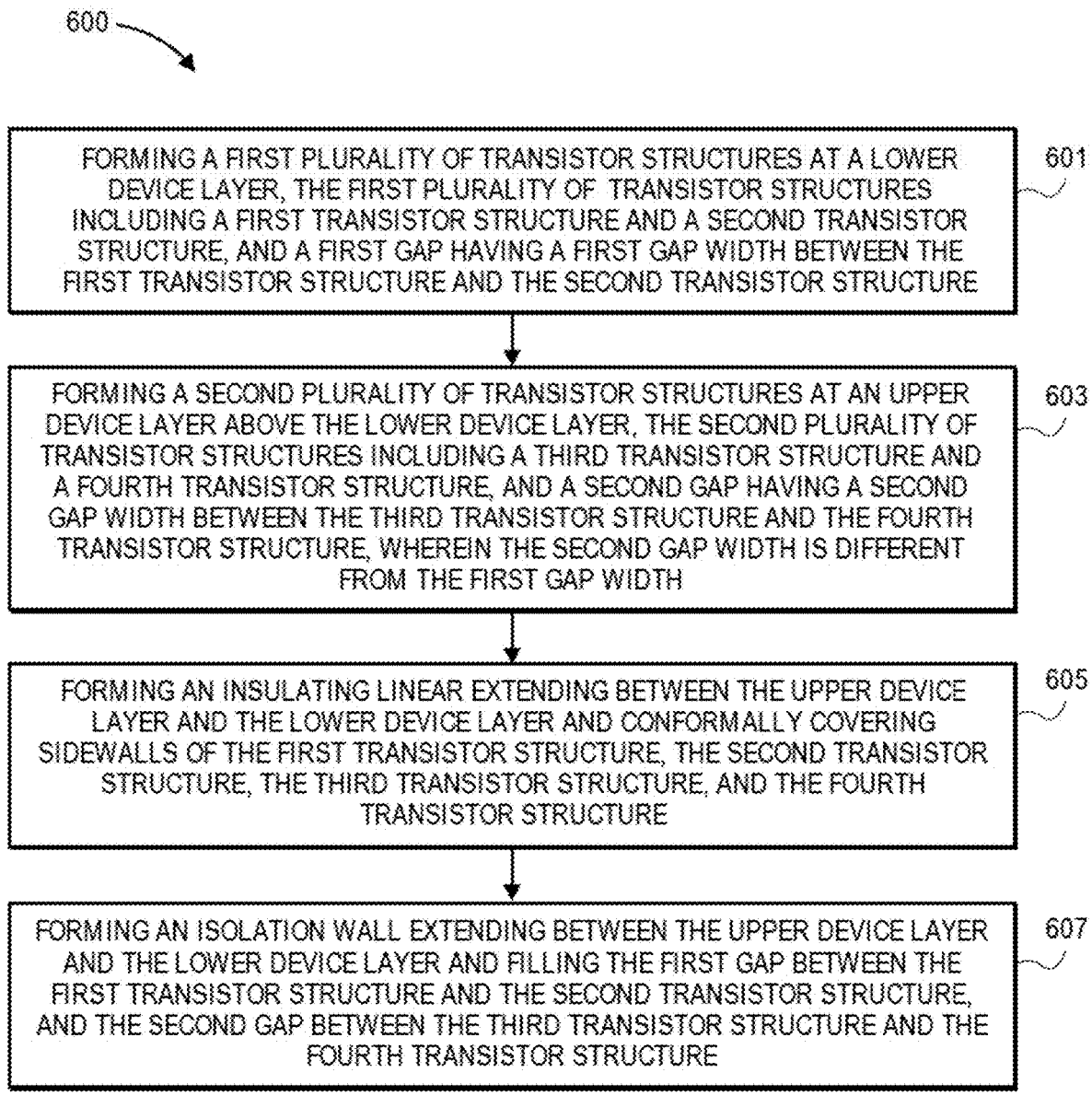
FIG. 6 illustrates a process for forming an IC including vertically stacked transistor structures, and isolation walls filling gaps between vertically stacked transistor structures, in accordance with some embodiments.
Figure 7A:
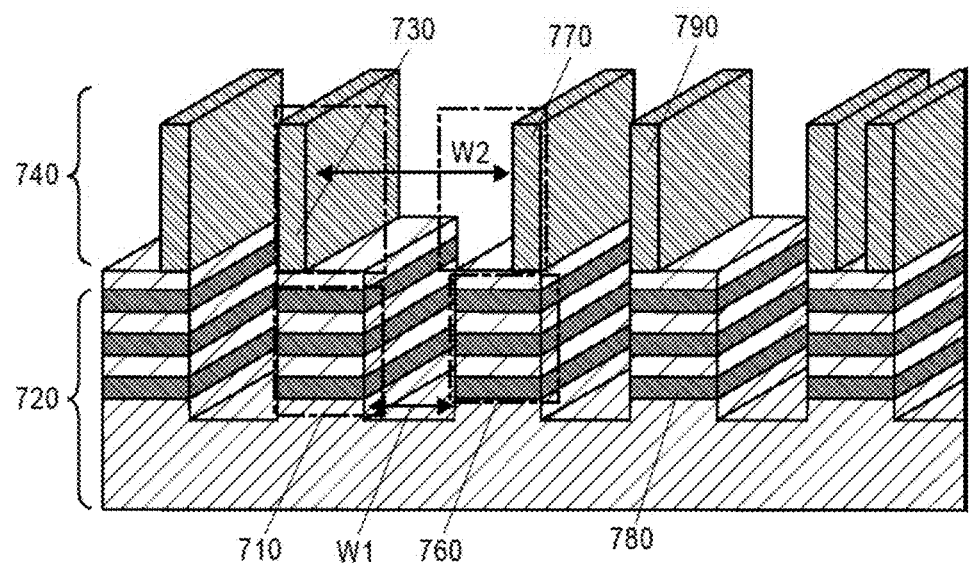
FIGS. 7(a)-7(c) illustrate a process for forming an IC including vertically stacked transistor structures, and isolation walls filling gaps between vertically stacked transistor structures, in accordance with some embodiments.
Figure 7B:
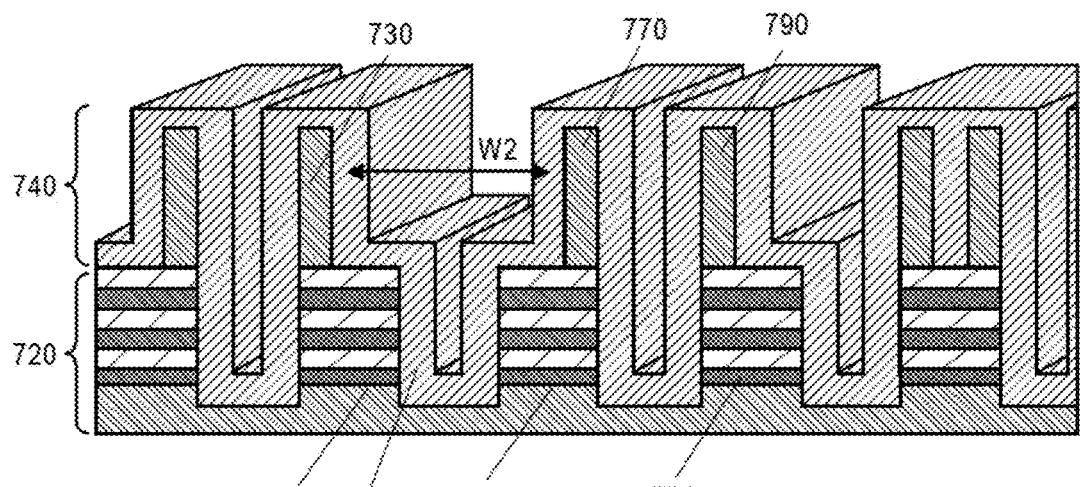
Figure 7C:
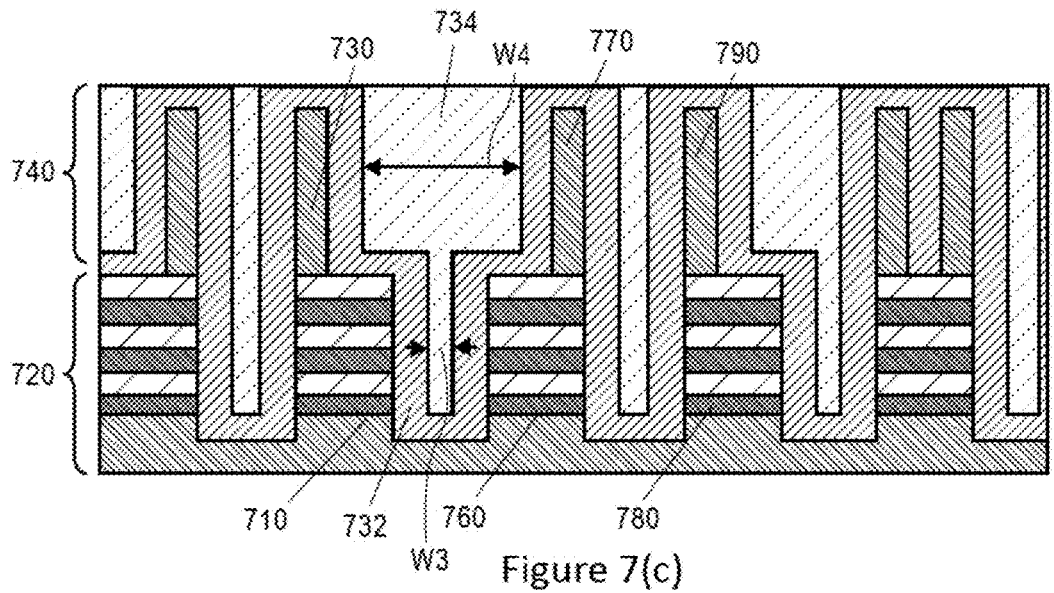

FIG. 6 illustrates a process 600 for forming an IC including vertically stacked transistor structures, and isolation walls filling gaps between vertically stacked transistor structures, in accordance with some embodiments. FIGS. 7(a)-7(c) may illustrate more details of the process 600. In embodiments, the process 600 may be applied to form the IC 400 including vertically stacked transistor structures, and the isolation wall 451 filling a gap 450 between vertically stacked transistor structures.

At block 601, the process 600 may include forming a first plurality of transistor structures at a lower device layer, the first plurality of transistor structures including a first transistor structure and a second transistor structure, and a first gap having a first gap width between the first transistor structure and the second transistor structure. For example, as shown in FIG. 7(a), the process 600 may include forming a first plurality of transistor structures at a lower device layer 720, e.g., a transistor structure 710, a transistor structure 760, a transistor structure 780. A gap having between the transistor structure 710 and the transistor structure 760 may have a gap width W1.

At block 603, the process 600 may include forming a second plurality of transistor structures at an upper device layer above the lower device layer, the second plurality of transistor structures including a third transistor structure and a fourth transistor structure, and a second gap having a second gap width between the third transistor structure and the fourth transistor structure, wherein the second gap width is different from the first gap width. For example, as shown in FIG. 7(a), the process 600 may include forming a second plurality of transistor structures, e.g., a transistor structure 730, a transistor structure 770, a transistor structure 790, at an upper device layer 740 above the lower device layer 720. A gap between the transistor structure 730 and the transistor structure 770 may have a gap width W2. The gap width W2 may be different from the gap width W1.

At block 605, the process 600 may include forming an insulating linear extending between the upper device layer and the lower device layer and conformally covering sidewalls of the first transistor structure, the second transistor structure, the third transistor structure, and the fourth transistor structure. For example, as shown in FIG. 7(b), the process 600 may include forming an insulating linear 732 extending between the upper device layer 740 and the lower device layer 720 and conformally covering sidewalls of the transistor structure 710, the transistor structure 760, the transistor structure 730, and the transistor structure 770.

At block 607, the process 600 may include forming an isolation wall extending between the upper device layer and the lower device layer and filling the first gap between the first transistor structure and the second transistor structure, and the second gap between the third transistor structure and the fourth transistor structure. For example, as shown in FIG. 7(c), the process 600 may include forming an isolation wall 734 extending between the upper device layer 740 and the lower device layer 720, and filling the gap between the transistor structure 710 and the transistor structure 760, and filling the gap between the transistor structure 730 and the transistor structure 770. The isolation wall 734 may have a width W3 at the lower device layer 720, and a width W4 at the upper device layer 740, where W3 may be different from W4.

Figure 8:
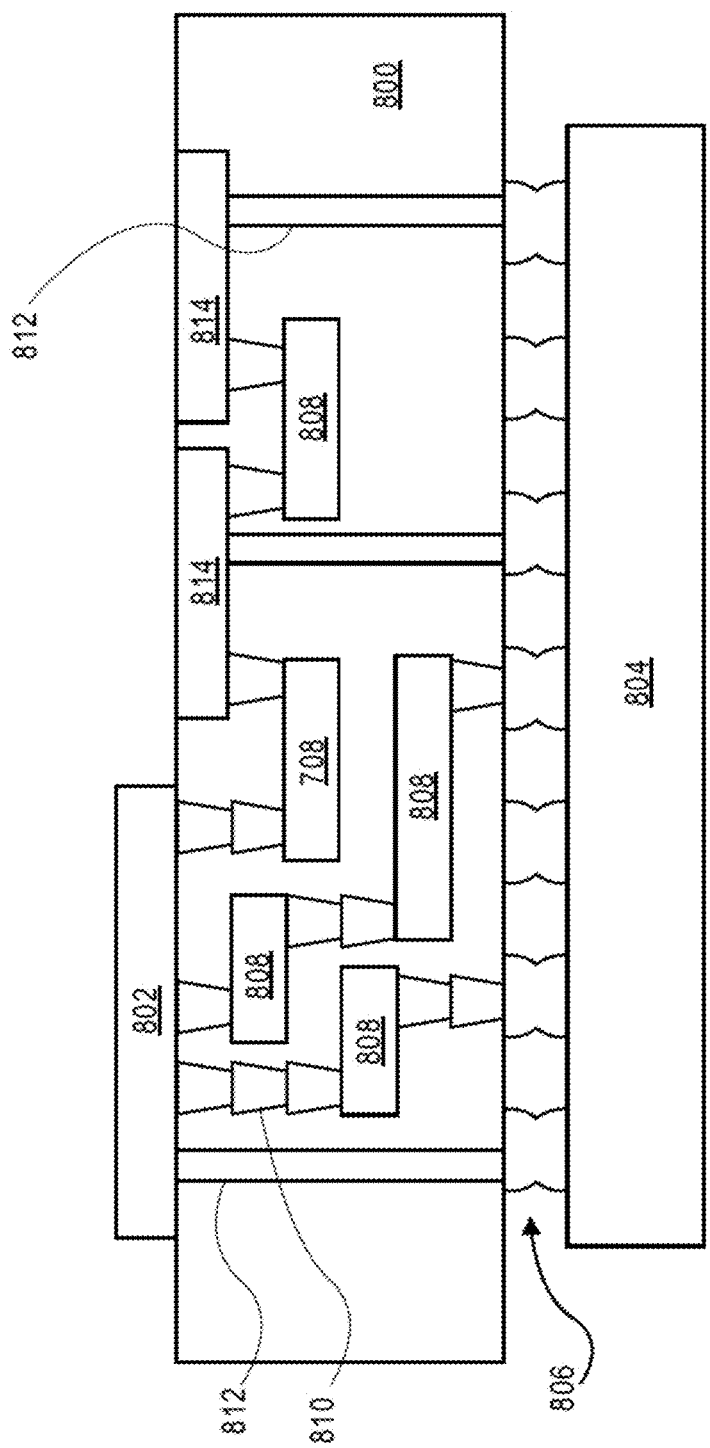
FIG. 8 schematically illustrates an interposer implementing one or more embodiments of the disclosure, in accordance with some embodiments.

FIG. 8 illustrates an interposer 800 that includes one or more embodiments of the disclosure. The interposer 800 is an intervening substrate used to bridge a first substrate 802 to a second substrate 804. The first substrate 802 may be, for instance, a substrate support for the transistor structure 130 stacked over the transistor structure 110 in FIG. 1, the transistor structure 230 stacked over the transistor structure 210 in FIG. 2, or the transistor structure 330 stacked over the transistor structure 310 in FIG. 3. The second substrate 804 may be, for instance, a memory module, a computer motherboard, or another integrated circuit die. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800.

In accordance with embodiments of the disclosure, apparatuses or processes disclosed herein may be used in the fabrication of interposer 800.

Figure 9:
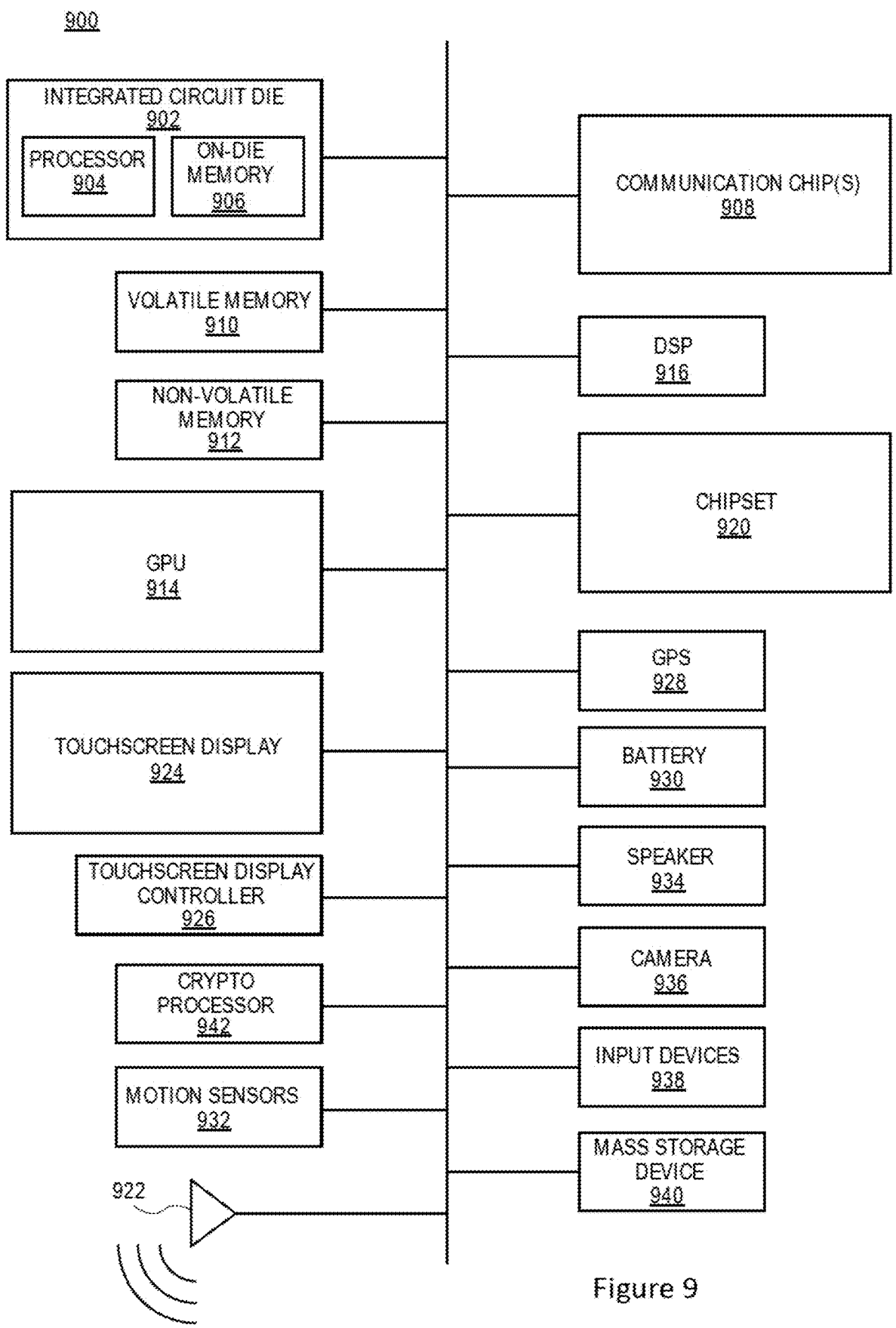
FIG. 9 schematically illustrates a computing device built in accordance with an embodiment of the disclosure, in accordance with some embodiments.

FIG. 9 illustrates a computing device 900 in accordance with one embodiment of the disclosure. The computing device 900 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 900 include, but are not limited to, an integrated circuit die 902 and at least one communications logic unit 908. In some implementations the communications logic unit 908 is fabricated within the integrated circuit die 902 while in other implementations the communications logic unit 908 is fabricated in a separate integrated circuit chip that may be bonded to a substrate or motherboard that is shared with or electronically coupled to the integrated circuit die 902. The integrated circuit die 902 may include a processor 904 as well as on-die memory 906, often used as cache memory, which can be provided by technologies such as embedded DRAM (eDRAM), or SRAM. For example, the on-die memory 906, the communications logic unit 908, or the integrated circuit die 902, may include, e.g., the transistor structure 130 stacked over the transistor structure 110 in FIG. 1, the transistor structure 230 stacked over the transistor structure 210 in FIG. 2, or the transistor structure 330 stacked over the transistor structure 310 in FIG. 3.

In embodiments, the computing device 900 may include a display or a touchscreen display 924, and a touchscreen display controller 926. A display or the touchscreen display 924 may include a FPD, an AMOLED display, a TFT LCD, a micro light-emitting diode (µLED) display, or others. For example, the touchscreen display 924 may include e.g., the transistor structure 130 stacked over the transistor structure 110 in FIG. 1, the transistor structure 230 stacked over the transistor structure 210 in FIG. 2, or the transistor structure 330 stacked over the transistor structure 310 in FIG. 3.

Computing device 900 may include other components that may or may not be physically and electrically coupled to the motherboard or fabricated within a SoC die. These other components include, but are not limited to, volatile memory 910 (e.g., dynamic random access memory (DRAM), non-volatile memory 912 (e.g., ROM or flash memory), a graphics processing unit 914 (GPU), a digital signal processor (DSP) 916, a crypto processor 942 (e.g., a specialized processor that executes cryptographic algorithms within hardware), a chipset 920, at least one antenna 922 (in some implementations two or more antenna may be used), a battery 930 or other power source, a power amplifier (not shown), a voltage regulator (not shown), a global positioning system (GPS) device 928, a compass, a motion coprocessor or sensors 932 (that may include an accelerometer, a gyroscope, and a compass), a microphone (not shown), a speaker 934, a camera 936, user input devices 938 (such as a keyboard, mouse, stylus, and touchpad), and a mass storage device 940 (such as hard disk drive, compact disk (CD), digital versatile disk (DVD), and so forth). The computing device 900 may incorporate further transmission, telecommunication, or radio functionality not already described herein. In some implementations, the computing device 900 includes a radio that is used to communicate over a distance by modulating and radiating electromagnetic waves in air or space. In further implementations, the computing device 900 includes a transmitter and a receiver (or a transceiver) that is used to communicate over a distance by modulating and radiating electromagnetic waves in air or space.

The communications logic unit 908 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 908 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 900 may include a plurality of communications logic units 908. For instance, a first communications logic unit 908 may be dedicated to shorter range wireless communications such as Wi-Fi, NFC, and Bluetooth and a second communications logic unit 908 may be dedicated to longer range wireless communications such as GPS, EDGE, GPRS, CDMA, WiMAX, LTE, Ev-DO, and others.

The processor 904 of the computing device 900 includes one or more devices, such as transistors. The term "processor" may refer to any device or portion of a device that processes electronic data from registers and/or memory to transform that electronic data into other electronic data that may be stored in registers and/or memory. The communications logic unit 908 may also include one or more devices, such as transistors.

In further embodiments, another component housed within the computing device 900 may contain one or more devices, such as DRAM, that are formed in accordance with implementations of the current disclosure, e.g., the transistor structure 130 stacked over the transistor structure 110 in FIG. 1, the transistor structure 230 stacked over the transistor structure 210 in FIG. 2, or the transistor structure 330 stacked over the transistor structure 310 in FIG. 3.

In various embodiments, the computing device 900 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Some non-limiting Examples are provided below.

Example 1 may include an IC structure, comprising: a lower device layer that includes a first transistor structure, wherein the first transistor structure includes a first set of non-planar transistor body structure, a first gate structure, and a first gate dielectric layer to separate the first set of non-planar transistor body structure from the first gate structure; an upper device layer above the lower device layer, the upper device layer including a second transistor structure, wherein the second transistor structure includes a second set of non-planar transistor body structure, a second gate structure, and a second gate dielectric layer to separate the second set of non-planar transistor body structure from the second gate structure; and an isolation wall that extends between the upper device layer and the lower device layer, wherein the isolation wall is in contact with an edge of the first gate structure and an edge of the second gate structure, the isolation wall has a first width to the edge of the first gate structure at the lower device layer, and a second width to the edge of the second gate structure at the upper device layer, and the first width is different from the second width; and the first gate structure has a first gate width between the edge of the first gate structure and an edge of the first gate dielectric layer, the second gate structure has a second gate width between the edge of the second gate structure and an edge of the second gate dielectric layer, and the first gate width and the second gate width are substantially equal.

Example 2 may include the integrated circuit structure of example 1 and/or some other examples herein, wherein the isolation wall is a first isolation wall, and the integrated circuit structure further comprises: a second isolation wall that extends between the upper device layer and the lower device layer, wherein the second isolation wall is in contact with a second edge of the first gate structure and a second edge of the second gate structure, the first gate structure has a third gate width between the second edge of the first gate structure and a second edge of the first gate dielectric layer, the second gate structure has a fourth gate width between the second edge of the second gate structure and a second edge of the second gate dielectric layer, and the third gate width and the fourth gate width are substantially equal.

Example 3 may include the integrated circuit structure of example 2 and/or some other examples herein, wherein the first gate width, the second gate width, the third gate width, and the fourth gate width are substantially equal.

Example 4 may include the integrated circuit structure of example 1 and/or some other examples herein, wherein the lower device layer has a first height with respect to a substrate, and the upper device layer has a second height with respect to the substrate, the first height is different from the second height.

Example 5 may include the integrated circuit structure of example 1 and/or some other examples herein, wherein the isolation wall includes a conductor.

Example 6 may include the integrated circuit structure of example 1 and/or some other examples herein, wherein the isolation wall includes an insulating liner conformal to sidewalls of the isolation wall.

Example 7 may include the integrated circuit structure of example 1 and/or some other examples herein, wherein the first transistor structure or the second transistor structure is a nanoribbon structure, a nanowire structure, or a FinFET structure.

Example 8 may include the integrated circuit structure of example 1 and/or some other examples herein, wherein the first transistor structure is rectangular, rounded, trapezoidal, or hourglass shaped.

Example 9 may include the integrated circuit structure of example 1 and/or some other examples herein, wherein the first transistor structure is a p-type transistor structure or an n-type transistor structure.

Example 10 may include the integrated circuit structure of example 1 and/or some other examples herein, wherein the first transistor structure is a nanoribbon structure, a nanowire structure, or a FinFET structure, and the second transistor structure is different from the first transistor structure.

Example 11 may include the integrated circuit structure of example 1 and/or some other examples herein, wherein the first transistor structure is a nanoribbon structure with a first number of nanoribbons, and the second transistor structure is a nanoribbon structure with a second number of nanoribbons; or the first transistor structure is a nanowire structure with a first number of nanowires, and the second transistor structure is a nanowire structure with a second number of nanowires; or the first transistor structure is a FinFET structure with a first number of fins, and the second transistor structure is a FinFET structure with a second number of fins; wherein the first number is different from the second number.

Example 12 may include the integrated circuit structure of example 1 and/or some other examples herein, wherein a first nanoribbon of the first transistor structure has a first body width, and a second nanoribbon of the second transistor structure has a second body width; or a first nanowire of the first transistor structure has a first body width, and a second nanowire of the second transistor structure has a second body width; or a first fin of the first transistor structure has a first body width, and a second fin of the second transistor structure has a second body width; wherein the first body width is different from the second body width.

Example 13 may include the integrated circuit structure of example 1 and/or some other examples herein, further includes a substrate below the lower device layer, wherein the substrate includes an III-V substrate, a silicon substrate, a bulk substrate, a silicon-on-insulator (SOI) substrate, or a partial-depleted SOI substrate.

Example 14 may include the integrated circuit structure of example 1 and/or some other examples herein, wherein the lower device layer further includes an insulator area next to the first transistor structure, or the upper device layer further includes an insulator area next to the second transistor structure.

Example 15 may include the integrated circuit structure of example 1 and/or some other examples herein, further includes an insulator layer between the lower device layer and the upper device layer.

Example 16 may include the integrated circuit structure of example 15 and/or some other examples herein, wherein the insulator layer includes a via through the insulator layer to couple a portion of the first transistor structure to a portion of the second transistor structure.

Example 17 may include the integrated circuit structure of example 15 and/or some other examples herein, wherein the insulator layer breaks the isolation wall into a first portion at the lower device layer and a second portion at the upper device layer, and the first portion is disjoint from the second portion.

Example 18 may include a method for forming an IC structure, comprising: forming a first plurality of transistor structures at a lower device layer, the first plurality of transistor structures including a first transistor structure and a second transistor structure, and a first gap having a first gap width between the first transistor structure and the second transistor structure; forming a second plurality of transistor structures at an upper device layer above the lower device layer, the second plurality of transistor structures including a third transistor structure and a fourth transistor structure, and a second gap having a second gap width between the third transistor structure and the fourth transistor structure, wherein the second gap width is different from the first gap width; forming an insulating linear extending between the upper device layer and the lower device layer and conformally covering sidewalls of the first transistor structure, the second transistor structure, the third transistor structure, and the fourth transistor structure; and forming an isolation wall extending between the upper device layer and the lower device layer and filling the first gap between the first transistor structure and the second transistor structure, and the second gap between the third transistor structure and the fourth transistor structure.

Example 19 may include the method of example 18 and/or some other examples herein, wherein the first transistor structure, the second transistor structure, the third transistor structure, or the fourth transistor structure is a nanoribbon structure, a nanowire structure, or a FinFET structure.

Example 20 may include the method of example 18 and/or some other examples herein, wherein the first transistor structure or the third transistor structure is a nanoribbon structure, a nanowire structure, or a FinFET structure, and the second transistor structure or the fourth transistor structure is different from the first transistor structure.

Example 21 may include a computing device, comprising: a circuit board; and an integrated circuit (IC) coupled to the circuit board, wherein the IC includes: a lower device layer that includes a first transistor structure, wherein the first transistor structure includes a first set of non-planar transistor body structure, a first gate structure, and a first gate dielectric layer to separate the first set of non-planar transistor body structure from the first gate structure; an upper device layer above the lower device layer, the upper device layer including a second transistor structure, wherein the second transistor structure includes a second set of non-planar transistor body structure, a second gate structure, and a second gate dielectric layer to separate the second set of non-planar transistor body structure from the second gate structure; and an isolation wall that extends between the upper device layer and the lower device layer, wherein the isolation wall is in contact with an edge of the first gate structure and an edge of the second gate structure, the isolation wall has a first width to the edge of the first gate structure at the lower device layer, and a second width to the edge of the second gate structure at the upper device layer, and the first width is different from the second width; and the first gate structure has a first gate width between the edge of the first gate structure and an edge of the first gate dielectric layer, the second gate structure has a second gate width between the edge of the second gate structure and an edge of the second gate dielectric layer, and the first gate width and the second gate width are substantially equal.

Example 22 may include the computing device of example 21 and/or some other examples herein, wherein the isolation wall includes a conductor.

Example 23 may include the computing device of example 21 and/or some other examples herein, wherein the isolation wall includes an insulating liner conformal to sidewalls of the isolation wall.

Example 24 may include the computing device of example 21 and/or some other examples herein, wherein the first transistor structure is a nanoribbon structure with a first number of nanoribbons, and the second transistor structure is a nanoribbon structure with a second number of nanoribbons; or the first transistor structure is a nanowire structure with a first number of nanowires, and the second transistor structure is a nanowire structure with a second number of nanowires; or the first transistor structure is a FinFET structure with a first number of fins, and the second transistor structure is a FinFET structure with a second number of fins; wherein the first number is different from the second number.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit structure, comprising:
a first device comprising a first stack of horizontal nanowires and a first gate structure over and surrounding the first stack of horizontal nanowires, each of the nanowires of the first stack of horizontal nanowires having a first lateral width, and the first gate structure having a second lateral width;
a second device vertically over the first device, the second device comprising a second stack of horizontal nanowires and a second gate structure over and surrounding the second stack of horizontal nanowires, each of the nanowires of the second stack of horizontal nanowires having a third lateral width different than the first lateral width, and the second gate structure having a fourth lateral width different than the second lateral width; and
an isolation wall laterally adjacent to the first device and the second device, the isolation wall having a first side opposite a second side, wherein the first side is a vertical edge, and the second side is adjacent to both the first gate structure and the second gate structure.

2. The integrated circuit structure of claim 1, wherein the third lateral width is less than the first lateral width, and the fourth lateral width is less than the second lateral width.

3. The integrated circuit structure of claim 2, wherein a portion of the isolation wall laterally adjacent to the second gate structure has a lateral width greater than a lateral width of a portion of the isolation wall laterally adjacent to the first gate structure.

4. The integrated circuit structure of claim 1, wherein the third lateral width is greater than the first lateral width, and the fourth lateral width is greater than the second lateral width.

5. The integrated circuit structure of claim 4, wherein a portion of the isolation wall laterally adjacent to the second gate structure has a lateral width less than a lateral width of a portion of the isolation wall laterally adjacent to the first gate structure.

6. The integrated circuit structure of claim 1, wherein the isolation wall is in direct contact with both the first gate structure and the second gate structure.

7. The integrated circuit of claim 1, wherein the first gate structure comprises a first gate dielectric and a first gate electrode, the first gate dielectric between the first gate electrode and each of the nanowires of the first stack of horizontal nanowires, and wherein the second gate structure comprises a second gate dielectric and a second gate electrode, the second gate dielectric between the second gate electrode and each of the nanowires of the second stack of horizontal nanowires.

8. The integrated circuit of claim 1, wherein the isolation wall has an uppermost surface co-planar with an uppermost surface of the second gate structure.

9. The integrated circuit of claim 1, wherein the isolation wall has a bottommost surface co-planar with a bottommost surface of the first gate structure.

10. The integrated circuit of claim 1, wherein the isolation wall has an uppermost surface co-planar with an uppermost surface of the second gate structure, and wherein the isolation wall has a bottommost surface co-planar with a bottommost surface of the first gate structure.

11. A computing device, comprising:
a board; and
a component coupled to the board, the component including an integrated circuit structure, comprising:
  a first device comprising a first stack of horizontal nanowires and a first gate structure over and surrounding the first stack of horizontal nanowires, each of the nanowires of the first stack of horizontal nanowires having a first lateral width, and the first gate structure having a second lateral width;
  a second device vertically over the first device, the second device comprising a second stack of horizontal nanowires and a second gate structure over and surrounding the second stack of horizontal nanowires, each of the nanowires of the second stack of horizontal nanowires having a third lateral width different than the first lateral width, and the second gate structure having a fourth lateral width different than the second lateral width; and
  an isolation wall laterally adjacent to the first device and the second device, the isolation wall having a first side opposite a second side, wherein the first side is a vertical edge, and the second side is adjacent to both the first gate structure and the second gate structure.

12. The computing device of claim 11, further comprising:
a memory coupled to the board.

13. The computing device of claim 11, further comprising:
a communication chip coupled to the board.

14. The computing device of claim 11, further comprising:
a battery coupled to the board.

15. The computing device of claim 11, wherein the component is a packaged integrated circuit die.

16. The computing device of claim 11, wherein the third lateral width is less than the first lateral width, and the fourth lateral width is less than the second lateral width.

17. The computing device of claim 16, wherein a portion of the isolation wall laterally adjacent to the second gate structure has a lateral width greater than a lateral width of a portion of the isolation wall laterally adjacent to the first gate structure.

18. The computing device of claim 11, wherein the third lateral width is greater than the first lateral width, and the fourth lateral width is greater than the second lateral width.

19. The computing device of claim 18, wherein a portion of the isolation wall laterally adjacent to the second gate structure has a lateral width less than a lateral width of a portion of the isolation wall laterally adjacent to the first gate structure.

20. The computing device of claim 11, wherein the isolation wall is in direct contact with both the first gate structure and the second gate structure.

* * * * *

UNITED STATES PATENT AND TRADEMARK OFFICE
CERTIFICATE OF CORRECTION

| | | |
|---|---|---|
| PATENT NO. | : 11,664,373 B2 | Page 1 of 1 |
| APPLICATION NO. | : 17/555296 | |
| DATED | : May 30, 2023 | |
| INVENTOR(S) | : Aaron Lilak et al. | |

It is certified that error appears in the above-identified patent and that said Letters Patent is hereby corrected as shown below:

On the Title Page

Item (72), Inventors: Aaron LILAK; Patrick MORROW; Gilbert DEWEY; Willy RACHMADY; Rishabh MEHANDRU; add:
Cheng-Ying HUANG Portland OR (US)

Signed and Sealed this
Nineteenth Day of September, 2023

Katherine Kelly Vidal
*Director of the United States Patent and Trademark Office*